US012660087B2

(12) United States Patent
Kuperstein et al.

(10) Patent No.: US 12,660,087 B2
(45) Date of Patent: Jun. 16, 2026

(54) MULTI-LEVEL BASEBOARD MANAGEMENT CONTROL STRUCTURE

(71) Applicant: MELLANOX TECHNOLOGIES, LTD., Yokneam (IL)

(72) Inventors: Itay Kuperstein, Haifa (IL); Doron Fael, Zichron Yaakov (IL); Yevgeny Yanovsky, Kiryat Yam (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 345 days.

(21) Appl. No.: 18/221,770

(22) Filed: Jul. 13, 2023

(65) Prior Publication Data

US 2025/0021139 A1 Jan. 16, 2025

(51) Int. Cl.
H05K 1/14 (2006.01)

(52) U.S. Cl.
CPC ..................................... H05K 1/144 (2013.01)

(58) Field of Classification Search
CPC ....................................................... H05K 1/144
See application file for complete search history.

(56) References Cited

U.S. PATENT DOCUMENTS

| | | | | |
|---|---|---|---|---|
| 5,460,531 A * | 10/1995 | Vivio | ................... | H05K 7/1092 439/70 |
| 10,402,357 B1 * | 9/2019 | Rao | ...................... | G06F 13/4022 |
| 2007/0058471 A1 * | 3/2007 | Rajan | ....................... | G11C 7/10 365/222 |
| 2013/0228917 A1 * | 9/2013 | Yoon | ................. | H01L 23/49838 257/737 |
| 2016/0328347 A1 * | 11/2016 | Worley | ............... | G06F 13/4022 |
| 2017/0185118 A1 * | 6/2017 | Iwata | ................... | G05B 19/042 |
| 2018/0049331 A1 * | 2/2018 | Voss | ......................... | H05K 5/03 |
| 2019/0182955 A1 * | 6/2019 | Murtagian | .............. | G06F 1/185 |
| 2019/0187909 A1 * | 6/2019 | Pinto | ...................... | H04L 43/00 |
| 2019/0280411 A1 * | 9/2019 | Olarig | ................. | G06F 13/4068 |
| 2021/0057840 A1 * | 2/2021 | Huang | .............. | H01R 12/7076 |

* cited by examiner

*Primary Examiner* — Farley Abad
(74) *Attorney, Agent, or Firm* — Sheridan Ross P.C.

(57) ABSTRACT

A baseboard management controller structure includes a microcontroller to provide baseboard management functions, levels of printed circuit board on which the microcontroller and peripheral circuits are mounted. The structure includes an interface to provide electrical communication between the microcontroller and a main board of a computing device.

20 Claims, 9 Drawing Sheets

106

130     130

121

130

103c

130

106

130     130     127

127

103c     130     127     130

130

127

127

103c     106     121     130     130     130     130

127     130     130     127     130     130     127     127     130

106

803 — Form PCB

806 — Mount components

809 — Fold PCB into a stack

812 — Attach support elements

815 — Attach stack to motherboard

800

MULTI-LEVEL BASEBOARD MANAGEMENT CONTROL STRUCTURE

FIELD OF THE DISCLOSURE

The present disclosure is generally directed to systems, methods, and devices for baseboard management and, in particular, for providing a small form-factor baseboard management controller.

BACKGROUND

Servers and other computing devices incorporating graphics processing units (GPUs) and/or data processing units (DPUs) are increasingly useful in various industries and applications due to their ability to deliver high-performance parallel processing capabilities. Such computing devices excel at handling computationally intensive tasks, such as graphics rendering, machine learning, artificial intelligence, big data analytics, scientific simulations, etc. As the demand for these types of workloads continues to grow, the integration of GPUs and DPUs into servers and other computing devices allows for more efficient processing, faster results, and lower latency, making them an essential component in modern data centers, cloud computing environments, and high-performance computing clusters.

In such computing devices, baseboard management controllers (BMCs) play a crucial role by ensuring the reliability, availability, and maintainability of the computing hardware. BMCs provide remote monitoring, management, and control functions for the components of the computing device, including the main processor, memory, and I/O devices, as well as GPUs and DPUs installed on the computing device. By monitoring the health and performance of these components, a BMC can detect potential issues, such as overheating or hardware failures, and take corrective actions to prevent system downtime or performance degradation. Furthermore, BMCs enable administrators and other users to remotely access and manage the computing device, regardless of the operating state, which is particularly valuable in large-scale data center environments where physical access to each server may not be practical.

Space-saving considerations are important for servers and other computing devices due to the increasing density and power demands of modern data centers and high-performance computing environments. As more processing power is packed into smaller form factors, space efficiency becomes a critical factor in optimizing data center infrastructure, reducing operational costs, and maximizing performance per watt. By designing servers and other computing devices with space-saving features, such as compact form factors, efficient cooling solutions, and modular components, manufacturers can enable data center operators to fit more hardware into a given footprint, reduce energy consumption, and minimize heat generation. This, in turn, allows for the deployment of more powerful and scalable computing solutions that can meet the ever-growing demands of today's data-intensive applications and workloads.

SUMMARY

While small form-factor computing devices are increasingly important, conventional BMCs require excessive physical space. For example, a conventional BMC is installed on both sides of a main board of a device, such as a GPU or DPU, which the BMC is to monitor. A conventional BMC also uses a relatively large surface area of the main board. The space requirements for conventional BMCs require the device being monitored to be larger than such a device without a BMC. As a result, a computing device with a conventional BMC is large and, in the case of a slot-mounted device such as a GPU or DPU, often requires two or more slots or cannot be mounted in a slot near another slot-mounted device.

Described herein is a BMC structure for providing out-of-band, or baseboard management for a device. A BMC structure as described herein is capable of being installed on a single side of a main board of the device while using less surface area than conventional BMCs. Using a BMC structure as described herein, the device on which the BMC structure is installed may be installed on a motherboard of a computing device such as a server using a single slot. In this way, a BMC structure as described herein provides compact form factors, modular components, and enables users such as data center operators to fit more hardware into a given footprint, reduce energy consumption, and minimize heat generation. This, in turn, allows for the deployment of more powerful and scalable computing solutions that can meet the ever-growing demands of today's data-intensive applications and workloads.

BRIEF DESCRIPTION OF THE DRAWINGS

The accompanying drawings are incorporated into and form a part of the specification to illustrate several examples of the present disclosure. These drawings, together with the description, explain the principles of the disclosure. The drawings simply illustrate preferred and alternative examples of how the disclosure can be made and used and are not to be construed as limiting the disclosure to only the illustrated and described examples. Further features and advantages will become apparent from the following, more detailed, description of the various aspects, embodiments, and configurations of the disclosure, as illustrated by the drawings referenced below.

The present disclosure is described in conjunction with the appended figures, which are not necessarily drawn to scale.

DETAILED DESCRIPTION

Figure 1:
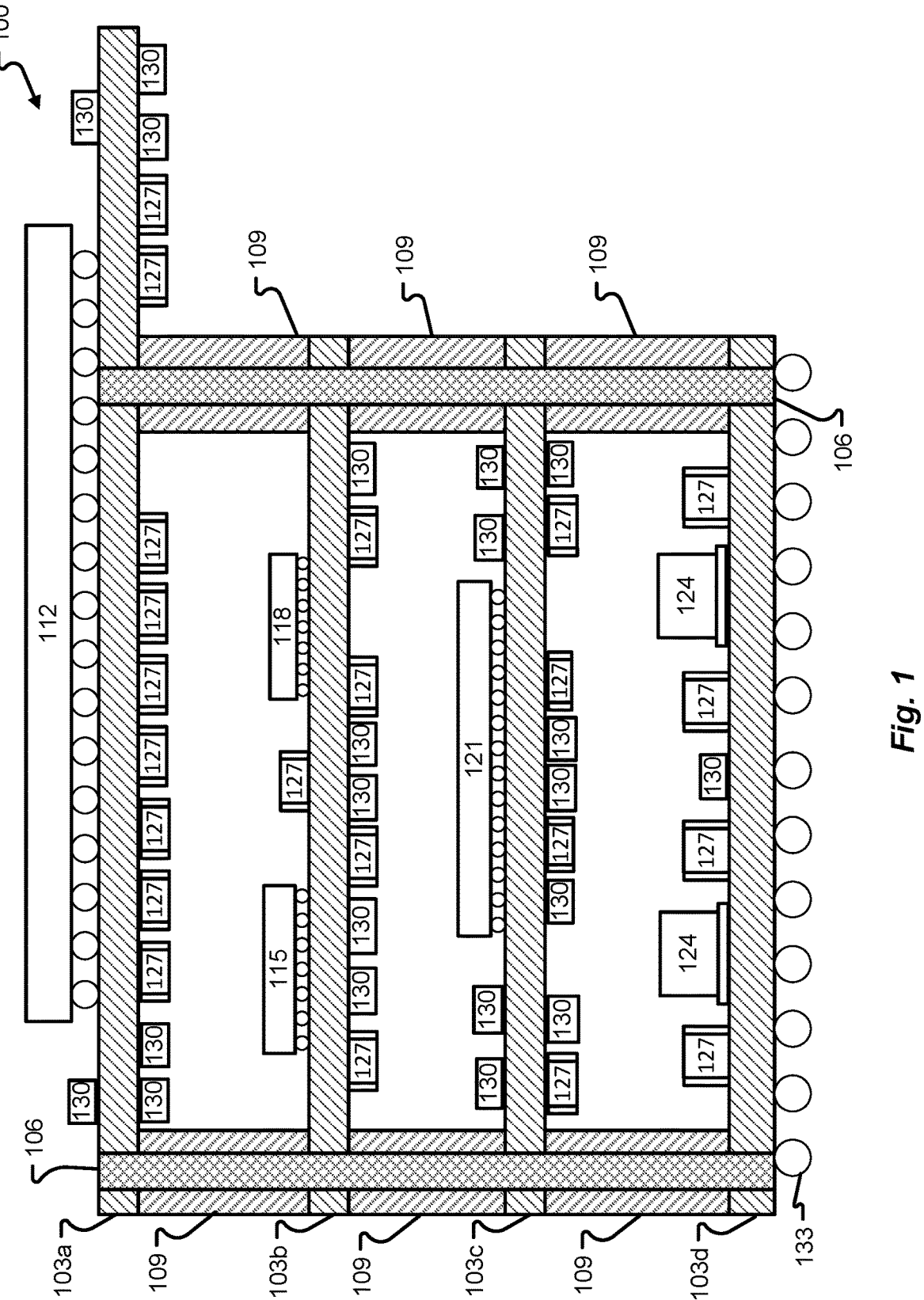
FIG. 1 is a block diagram of a BMC structure in accordance with one or more embodiments of the present disclosure.

Before any embodiments of the disclosure are explained in detail, it is to be understood that the disclosure is not limited in its application to the details of construction and the arrangement of components set forth in the following description or illustrated in the drawings. The disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, the present disclosure may use examples to illustrate one or more aspects thereof. Unless explicitly stated otherwise, the use or listing of one or more examples (which may be denoted by "for example," "by way of example," "e.g.," "such as," or similar language) is not intended to and does not limit the scope of the present disclosure.

The details of one or more aspects of the disclosure are set forth in the accompanying drawings and the description below. Other features, objects, and advantages of the techniques described in this disclosure will be apparent from the description and drawings, and from the claims.

The phrases "at least one," "one or more," and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together. When each one of A, B, and C in the above expressions refers to an element, such as X, Y, and Z, or class of elements, such as X1-Xn, Y1-Ym, and Z1-Zo, the phrase is intended to refer to a single element selected from X, Y, and Z, a combination of elements selected from the same class (e.g., X1 and X2) as well as a combination of elements selected from two or more classes (e.g., Y1 and Zo).

The term "a" or "an" entity refers to one or more of that entity. As such, the terms "a" (or "an"), "one or more" and "at least one" can be used interchangeably herein. It is also to be noted that the terms "comprising," "including," and "having" can be used interchangeably.

The preceding Summary is a simplified summary of the disclosure to provide an understanding of some aspects of the disclosure. This summary is neither an extensive nor exhaustive overview of the disclosure and its various aspects, embodiments, and configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and configurations of the disclosure are possible utilizing, alone or in combination, one or more of the features set forth above or described in detail below.

Numerous additional features and advantages are described herein and will be apparent to those skilled in the art upon consideration of the following Detailed Description and in view of the figures.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims. Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

It will be appreciated from the following description, and for reasons of computational efficiency, that the components of the system can be arranged at any appropriate location within a distributed network of components without impacting the operation of the system.

Further, it should be appreciated that the various links connecting the elements can be wired, traces, or wireless links, or any appropriate combination thereof, or any other appropriate known or later developed element(s) that is capable of supplying and/or communicating data to and from the connected elements. Transmission media used as links, for example, can be any appropriate carrier for electrical signals, including coaxial cables, copper wire and fiber optics, electrical traces on a printed circuit board (PCB), or the like.

The terms "determine," "calculate," and "compute," and variations thereof, as used herein, are used interchangeably, and include any appropriate type of methodology, process, operation, or technique.

Various aspects of the present disclosure will be described herein with reference to drawings that may be schematic illustrations of idealized configurations.

Any of the steps, functions, and operations discussed herein can be performed continuously and automatically.

The systems and methods of this disclosure have been described in relation to a network of switches; however, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others.

References in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases may not necessarily refer to the same embodiment. Further, when a particular feature, structure, or characteristic is described in conjunction with one embodiment, it is submitted that the description of such feature, structure, or characteristic may apply to any other embodiment unless so stated and/or except as will be readily apparent to one skilled in the art from the description. The present disclosure, in various embodiments, configurations, and aspects, includes components, methods, processes, systems and/or apparatus substantially as depicted and described herein, including various embodiments, sub combinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

A BMC is a specialized microcontroller embedded on a server's main board. It is responsible for monitoring and managing various aspects of a server's hardware components, including power, cooling, sensors, and providing remote administration capabilities. The BMC is an essential component of the Intelligent Platform Management Interface (IPMI), which is a standardized interface for hardware-level management of servers.

BMCs have several uses, including providing remote monitoring and control of components such as GPUs and DPUs. For example, a BMC as described herein may enable administrators to monitor a server's vital signs, such as temperature, fan speed, and power consumption, from a remote location. This allows for proactive monitoring and timely intervention in case of issues. A BMC may also provide administrators with the ability to remotely power on, power off, or reset a server. This can be particularly useful in cases where physical access to the server is limited or restricted. A BMC can be used to diagnose hardware issues by collecting and analyzing sensor data, providing error logs, and running diagnostic tests.

A BMC can also facilitate remote updates to a server's firmware or basic input/output system (BIOS), ensuring that the server is always running the latest and most secure version. Also, when a server experiences hardware or performance issues, an administrator can access a BMC remotely via a dedicated network interface or an out-of-band management port. The administrator can then gather system health data, view error logs, and even power-cycle the server if necessary, all without physically being present at the server's location.

A BMC microcontroller requires multiple components other than the microcontroller to operate. For example, voltage regulators, memory devices, passive components such as capacitors and resistors, and/or other components such as external root of trust (EROT) devices, may be required. While a BMC microcontroller provides a benefit to a device such as a GPU or DPU, adding a BMC and the additional components used by the BMC consumes space on the main board of the device.

Conventional BMCs use more area of the main board and both sides of the main board. For example, a conventional BMC consumes around 1800 square millimeters on both sides of a PCB.

Using a BMC structure as described herein on the other hand, a structure may consume less space. For example, in accordance with one embodiment, a BMC structure takes up 21×27 mm, or 567 square millimeters, and only on a single side of a PCB. As a result, more components can fit on the main board, including on the opposite side of the BMC structure.

A BMC structure as described herein also provides modularity. For example, if a particular use case necessitates an Ethernet switch, a switch can be added to the structure without increasing the area of the main board consumed by the BMC structure. Also, components can be added without requiring the BMC structure to be removed completely from the main board. This allows the BMC structure to be soldered to the main board while still providing modular benefits.

As new component options are developed, such as new microcontrollers, individual parts of a BMC structure as described herein can be replaced without requiring the mainboard to be respun. As a result, a BMC structure as described herein can be useful for greater periods of time as compared to conventional BMCs.

Using a BMC structure which consumes less space on a main board offers several benefits, particularly in terms of system design, performance, and power efficiency. This is especially beneficial in applications where space is at a premium, such as servers and small form factor (SFF) computers. Also, smaller components enable higher component density on the main board, allowing for more functionality in a given space. This can lead to more feature-rich systems with increased capabilities, such as additional expansion slots, memory modules, or input/output (I/O) ports. By using smaller components, manufacturers can reduce the size of the printed circuit board (PCB) and overall material costs. Moreover, smaller components often require less raw material and may lead to lower production costs.

What is needed is a BMC capable of being mounted to a main board while taking up less space. As described herein, a BMC structure may be provided on a main board using less space and only one side of the main board PCB, enabling the BMC structure to consume less space on the main board and for additional main board components to be mounted on a back side of the PCB below the BMC structure. Also, a BMC structure as described herein may include one or more escalated levels of PCB which extend horizontally outward further than the lowest level forming a balcony on which components may be mounted. This enables components on the main board to be mounted underneath the balcony, further reducing the required space of the BMC structure.

As described herein, a BMC structure is modular and enables users to tailor computing systems to specific needs, choosing components that best match particular use-case requirements. Such flexibility makes it easier to build a system optimized for performance, power efficiency, or any other desired feature set.

A BMC structure as described herein enables upgrading individual components of the BMC structure. As technology evolves, users can replace outdated parts with newer, more powerful components, extending the life of the BMC and improving performance without having to replace the entire BMC structure. Also, when a component on the BMC structure fails or experiences issues, the individual component can be quickly and easily replaced, reducing downtime and maintenance costs.

A BMC structure as described herein can also be scaled by adding additional or different levels and components to accommodate changing needs or growing workloads, providing a more efficient way to adapt to evolving requirements.

By providing a modular BMC structure, vendor dependencies are reduced, enabling designers to choose from a wider selection of components, mitigating potential procurement sourcing concerns.

Using a BMC structure as described herein, a main board, such as a GPU or DPU including a BMC structure can fit in a single slot on a motherboard of a computing device such as a server. By enabling a BMC to be used on a single slot main board, the design is less restrictive, and the BMC can be used in more applications. This enables use cases such as a user with a server who wants a server with two slots to have one DPU and one GPU. By using only one slot, the BMC described herein enables the user to install each of the DPU and the GPU with BMCs.

A BMC structure as described herein is superior to alternatives. For example, mezzanine cards are of a width greater than a single slot, and to fit conventional BMCs into half-height half-length, requires removing features such as memory devices. Also, integrating a BMC into an application-specific integrated circuit (ASIC) requires increasing the die-size of the ASIC as well as increasing the cost and complexity of the design of the ASIC. Additionally, a BMC should be attached to the device (e.g., DPU) which it is monitoring. A BMC structure as described herein resolves all of these issues, by providing BMC capability for a device while saving room on a main board of the device and enabling the device to be mounted using a single slot.

As illustrated in FIG. 1, a BMC structure 100 in accordance with at least one embodiment comprises a plurality of printed circuit boards (PCBs) 103a-d stacked in levels.

Each component of the BMC structure 100 may be mounted onto one of the PCBs 103a-d as described in greater detail below. The components on the PCBs 103a-d may be interconnected by traces in each of the PCBs 103a-d. For example, each PCB 103a-d may be a single- or multi-layer PCB comprising any number of traces enabling communication between the components.

A support system 109 may be installed between each of the PCBs 103a-d. For example, a support system 109 may comprise bolts and washers or risers on which each PCB 103a-d may be mounted. In some embodiments, the support system 109 may be a wall on one or more edges of the PCBs 103b-d other than the top PCB 103a. For example, the support system 109 may surround an outer edge of each of the lower PCBs 103b-d.

The support system 109 may enable the levels to be separated, providing a modular design in which components and/or complete PCBs 103a-d may be replaced or added.

Each PCB 103a-d may be connected to one or more other PCBs 103a-d enabling communication between the PCBs 103a-d. For example, in some embodiments, the support system 109 may comprise electrical communication channels 106. In some embodiments, each PCB 103a-d may be linked to each PCB 103a-d above and below the PCB 103a-d. For example, a second level PCB 103c may be in electrical communication with a first level PCB 103d and a third level PCB 103b.

The bottom PCB 103d may be of a smaller area as compared to conventional BMC devices. For example, the bottom PCB 103d may be 21 millimeters wide and 27 millimeters deep. It should be appreciated that each PCB 103a-d may be of a different size. For example, as illustrated in FIG. 1, a top level 103a may extend out from the other levels. As described in greater detail below, this feature enables the tower BMC 100 to consume less than ¼ of the space on the main board which the PCBs 103-ad would consume if not stacked.

The BMC structure 100 includes an interface 133 by which the BMC structure 100 may be mounted to a main board and be enabled to communicate with or through the main board. The interface 133 may be a ball grid array (BGA) surface-mount form factor, making the BMC structure 100 a surface-mount package which can be soldered to the main board using metallic conductor balls arranged in an array.

In some embodiments, the interface 133 may be capable of mounting to a slot or a socket on the main board, providing a removably connected BMC structure 100. For example, the interface 133 may be a pin grid array (PGA) or a land grid array (LGA).

Via the interface 133, the BMC structure 100 may be capable of receiving data from the main board of the device which the BMC structure 100 is mounted and of transmitting data to the main board. A dedicated network port for out-of-band management may be included on the main board, allowing the BMC structure 100 to communicate with remote administrators over a separate network.

As described above, on each PCB 103a-d of the BMC structure 100 may be mounted one or more components. Such components may include, for example, a microcontroller 112 and peripheral components which may be used by the microcontroller 112 to operate as a baseboard management controller.

The microcontroller 112 may be a dedicated BMC microcontroller, such as an ASPEED AST2600 Advanced peripheral component interconnect express (PCIe) Graphics and Remote Management Processor. While a BMC microcontroller is used as an example of the microcontroller 112, it should be considered other microcontrollers may be used. For example, the BMC structure 100 may be capable of providing any type of computing service other than or in addition to baseboard management.

As used herein, a microcontroller 112 may refer to one or more processors or microprocessors, such as central processing units (CPUs). As an example, the microcontroller 112 may be or comprise an ARM microprocessor such as the ARM Cortex-A7. The microcontroller may be responsible for executing instructions, performing arithmetic and logic operations, and managing data flow within the BMC structure 100. As an example, a microcontroller 112 may be a system-on-chip (SoC) and may include support for peripheral components in the BMC structure 100 as described below.

Peripheral circuits such as may be necessary for operation of the microcontroller 112 may also be mounted to the PCBs 103a-d. Such peripheral circuits may include components such as voltage regulators (VRs) 124, memory devices such as random access memory (RAM), dynamic RAM (DRAM), double data rate 4 (DDR4) 503, electrically erasable programmable read-only memory (EEPROM), a serial peripheral interface flash (SPI flash) 115, etc., EROT 118 devices, passive components such as capacitors 127, inductors, and resistors 130, an ethernet switch 121, a power switch, one or more oscillators (OSCs), connectors, and/or other components.

VRs 124 may be electronic components or circuits capable of maintaining a stable and consistent output voltage, despite variations in input voltage or changes in load conditions. A VR 124 as described herein may be a linear VR or a switch VR and may be capable of ensuring the microcontroller 112 and/or other components on the BMC structure 100 receives stable and consistent voltage levels, protecting the components from damage and improving overall system reliability and performance.

The microcontroller 112 may utilize one or more volatile and/or non-volatile memory devices. As examples, a DRAM device may be used as system memory or for temporary data storage or caching, a DDR4 503 device may be used for data transfer and/or system memory, an EEPROM device may be used for firmware updates and configuration changes such as by storing firmware, calibration data, or other information, also, an SPI flash 115 device may be used for data transfer between the microcontroller 112 and the peripheral components. These examples should be considered only as examples, as additional or alternative memory devices may be used, and each memory device may be used for any type of memory function.

The BMC structure 100 may in some embodiment include an EROT 118. An EROT 118 may comprise one or more hardware security modules, secure elements, trusted platform modules, hardware security tokens, etc., capable of providing root of trust for ensuring the integrity, authenticity, and confidentiality of the functioning of the components of the BMC structure 100. The EROT 118 may be designed to be resistant to tampering and to provide critical security functions.

The BMC structure 100 may in some embodiments include a switch 121 such as an Ethernet switch. The switch 121 may in some embodiments comprise a four-port Ethernet switch, but it should be appreciated any type of networking device may additionally or alternatively be used by the BMC structure 100, such as any type of switch capable of providing the BMC structure 100 with local-area network (LAN) connectivity to other devices.

The BMC structure 100 may also include one or more capacitors 127 and resistors 130 as may be needed by the components described above. Capacitors 127 may be used to stabilize voltage levels, filter signals, and store energy, ensuring smooth operation of the components. Resistors may be used to control current flow, divide voltages, and set operational parameters for the various components.

The BMC structure 100 may also include one or more other components, such as sensors, cooling fans, power supply units, LEDs, serial and USB interfaces, optical cable connections, etc.

As described above, the layout of the levels of PCBs 103*a-d* provides the BMC structure 100 with the ability to be mounted on a main board of a device such as a GPU or DPU in a smaller space as compared to conventional BMC devices. While the components mounted to each level of PCB 103*a-d* may vary depending on the particular microcontroller 112, peripheral components, and passive components being used, an embodiment of a BMC structure 100 may include four levels of PCBs 103*a-d* as described below. While the figures illustrate each of the PCBs 103*a-d* of the tower BMC 100 as comprising particular components, it should be appreciated that components may be placed on any of the PCBs 103*a-d*. The description below describes the arrangement of a particular embodiment, but the disclosure should not be considered as limited to such an embodiment.

Figure 2A:
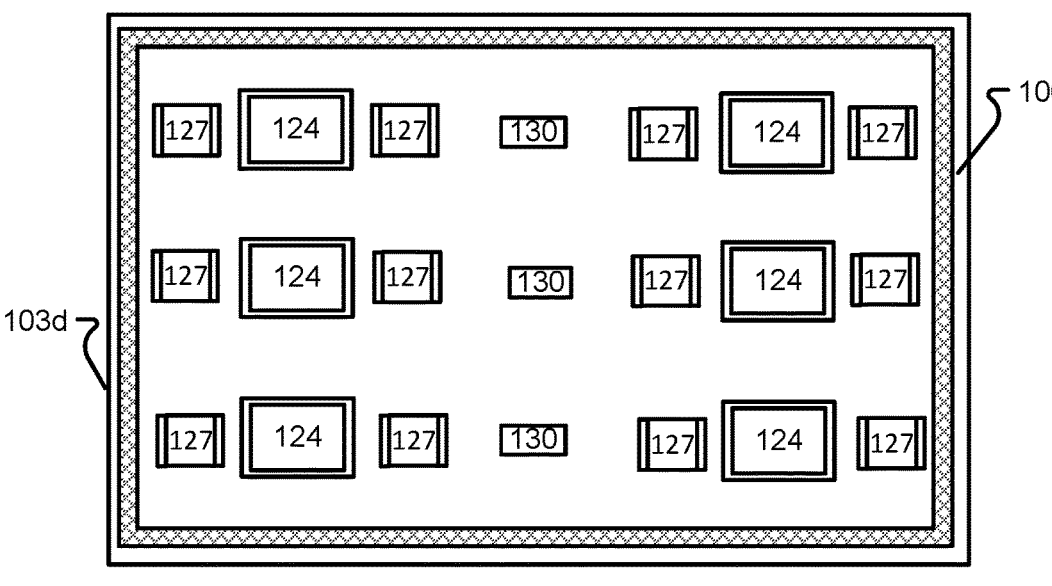
FIGS. 2A-2C are block diagrams of a level of a BMC structure in accordance with one or more embodiments of the present disclosure.
Figure 2B:
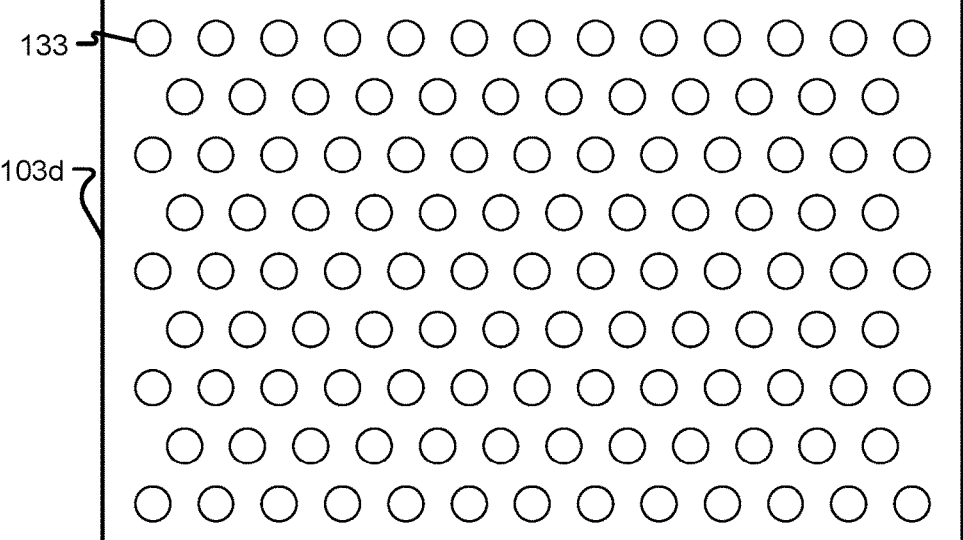
Figure 2C:
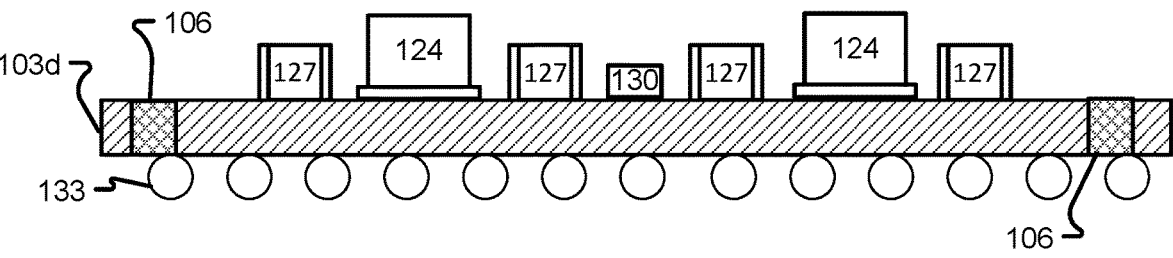

FIG. 2A is a top-down illustration of a bottom level PCB 103*d* of the BMC structure 100 illustrated in FIG. 1. FIG. 2B is a bottom-up illustration of the bottom level PCB 103*d*. FIG. 2C is a side profile of the bottom level PCB 103*d*.

As illustrated in FIG. 2A, the bottom level PCB 103*d* of the BMC structure 100 may comprise one or more voltage regulators (VRs) 124, capacitors 127, and resistors. VRs 124 may be selected for placement on a bottom level PCB 103*d* of the tower BMC 100 in some embodiments as VRs 124 may be placed without requiring additional parts on the back or underside of the PCB 103*d*. Passive components needed by the VRs 124, such as capacitors 127 and resistors 130, can be placed on the same side of the PCB 130*d* as the VRs 124.

By placing all components of the PCB 103*d* on a top-side of the PCB 103*d*, the bottom-side of the bottom level PCB 103*d* may be reserved for the interface 133, e.g., a BGA. As illustrated in FIG. 2B, the interface 133 may comprise a BGA, or grid of solder balls for mounting the BMC structure 100 to a main board. Communication to and from the BMC structure 100 may be provided via the interface 133.

As illustrated by the side profile of the bottom level PCB 103*d* in FIG. 2C, the PCB 103*d* may be detachable from other PCB levels of the BMC structure 100. Communication between the bottom level PCB 103*d* and other levels of the BMC structure 100 may be established via the electrical communication channels 106. As illustrated in FIG. 2A, an electrical communication channel 106 may surround an outer perimeter of the PCB 103*d*. However, it should be appreciated that other layouts may be used in certain embodiments.

Figures 3A, 3B, 3C:
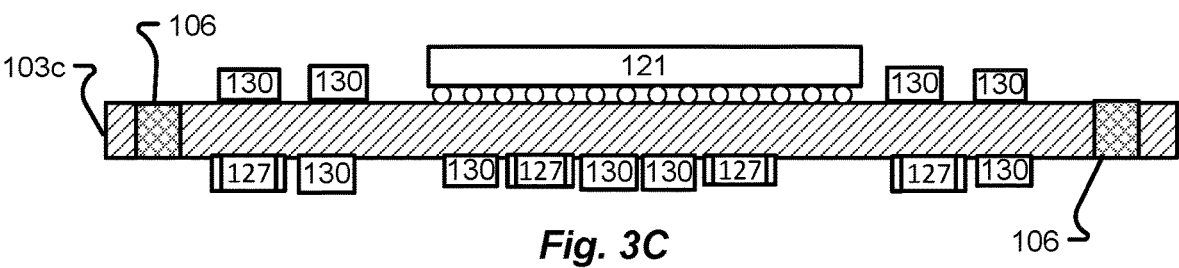
FIGS. 3A-3C are block diagrams of a level of a BMC structure in accordance with one or more embodiments of the present disclosure.

FIG. 3A is a top-down illustration of a LAN level PCB 103*c* of the BMC structure 100 illustrated in FIG. 1. FIG. 3B is a bottom-up illustration of the LAN level PCB 103*c*. FIG. 3C is a side profile of the LAN level PCB 103*c*.

The LAN level PCB 103*c* of the BMC structure 100 may comprise one or more switches 121, such as an Ethernet switch, one or more passive components such as capacitors 127 and resistors 130, and/or other components. Any of the switch(es) 121, capacitors 127, resistors 130, and/or other components may be mounted to the LAN level PCB 103*c* on a top-side or a bottom-side.

As illustrated by the side profile of the Lan level PCB 103*c* in FIG. 3C, the PCB 103*c* may be detachable from other PCB levels of the BMC structure 100. Communication between the bottom level PCB 103*c* and other levels of the BMC structure 100 may be established via the electrical communication channels 106. As illustrated in FIG. 3A, an electrical communication channel 106 may surround an outer perimeter of the PCB 103*c*. However, it should be appreciated that other layouts may be used in certain embodiments.

Depending on particular use-case system requirements, in some embodiments a BMC structure 100 may be implemented without including a LAN level PCB 103*c*.

Figure 4A:
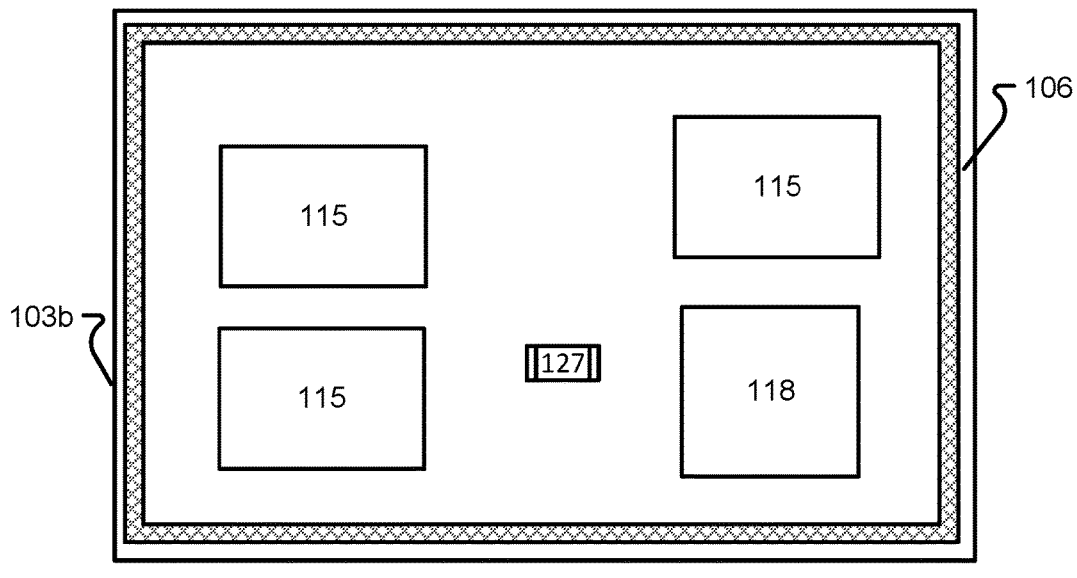
FIGS. 4A-4C are block diagrams of a level of a BMC structure in accordance with one or more embodiments of the present disclosure.
Figure 4B:
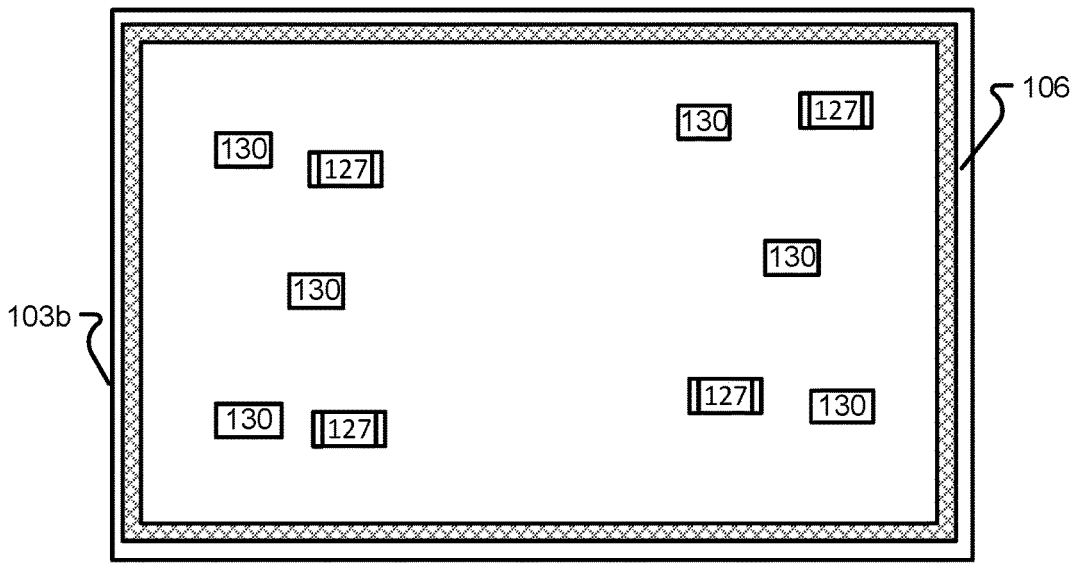
Figure 4C:
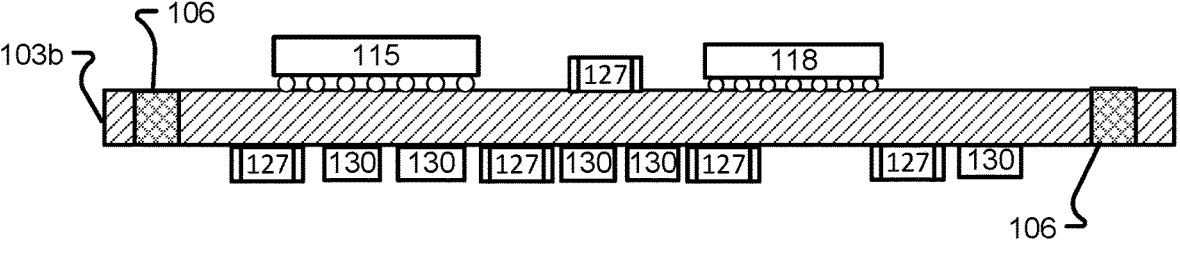

FIG. 4A is a top-down illustration of a middle level PCB 103*b* of the BMC structure 100 illustrated in FIG. 1. FIG. 4B is a bottom-up illustration of the middle-level PCB 103*b*. FIG. 4C is a side profile of the middle-level PCB 103*b*.

The middle-level PCB 103*b* of the BMC structure 100 may comprise one or more memory devices, such as SPI flashes 115, one or more EROT 118 devices, one or more power switches, one or more passive components such as capacitors 127 and resistors 130, and/or other components. Any of the memory devices, such as SPI flashes 115, one or more EROT 118 devices, one or more power switches, capacitors 127, resistors 130, and/or other components may be mounted to the middle-level PCB 103*b* on a top-side or a bottom-side.

As illustrated by the side profile of the middle-level PCB 103*b* in FIG. 4C, the PCB 103*b* may be detachable from other PCB levels of the BMC structure 100. Communication between the middle-level PCB 103*b* and other levels of the BMC structure 100 may be established via the electrical communication channels 106. As illustrated in FIG. 4A, an electrical communication channel 106 may surround an outer perimeter of the PCB 103*b*. However, it should be appreciated that other layouts may be used in certain embodiments.

Figure 5A:
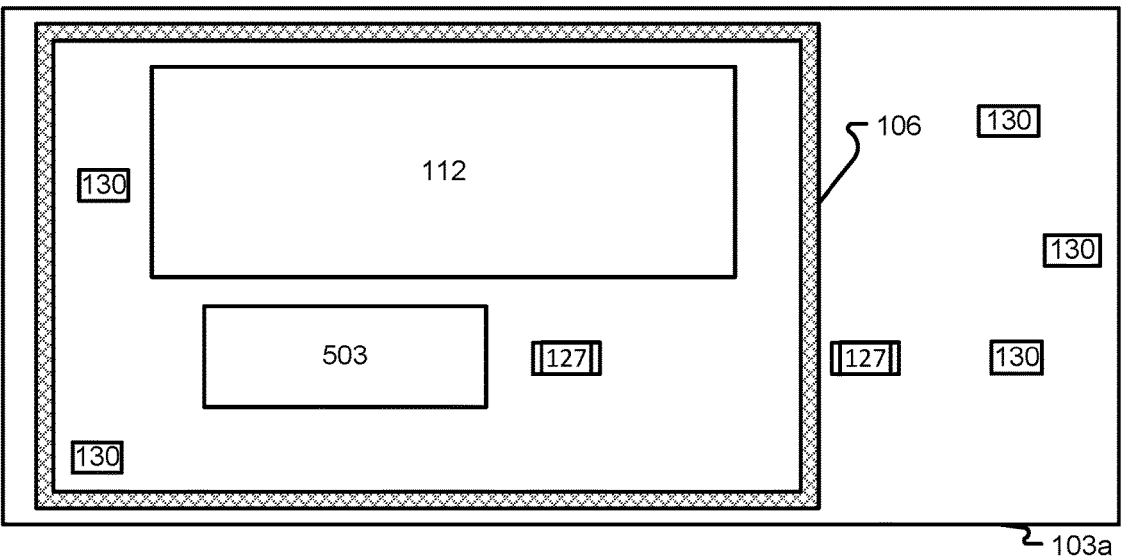
FIGS. 5A-5C are block diagrams of a level of a BMC structure in accordance with one or more embodiments of the present disclosure.
Figure 5B:
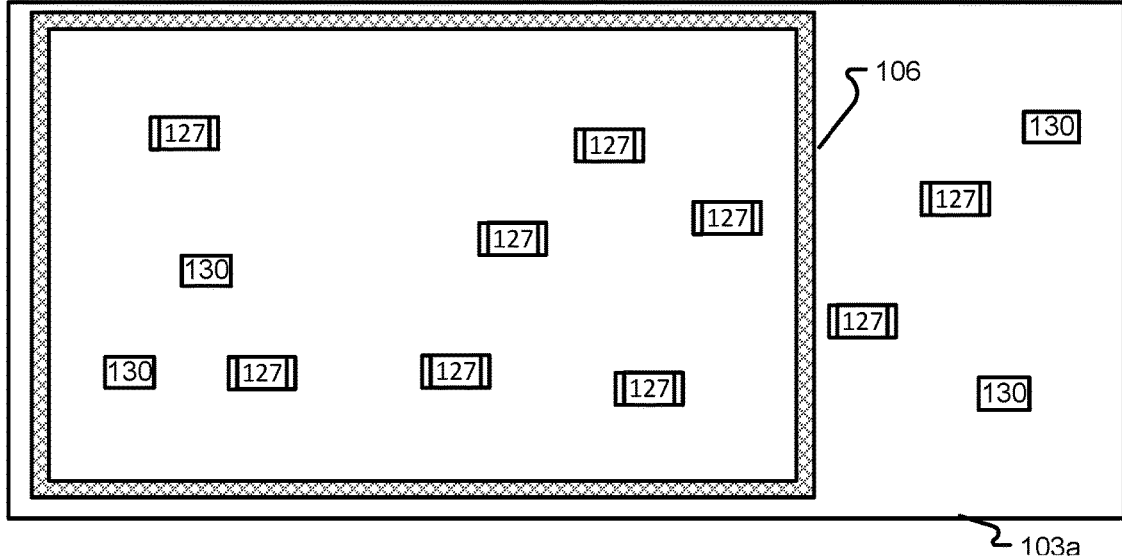
Figure 5C:
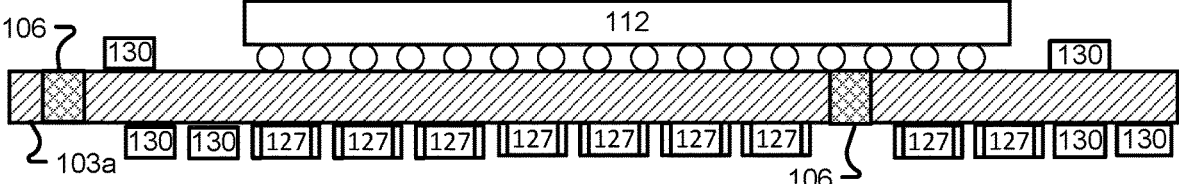

FIG. 5A is a top-down illustration of an upper-level PCB 103*a* of the BMC structure 100 illustrated in FIG. 1. FIG. 5B is a bottom-up illustration of the upper-level PCB 103*a*. FIG. 5C is a side profile of the upper-level PCB 103*a*.

The top, or upper levels of the BMC structure provide the largest surface size and the most headroom. As a result, the largest components of the BMC structure 100, such as a microcontroller, ethernet switch, etc., may be placed on the upper levels.

The top-level PCB 103a of the BMC structure 100 may comprise one or more microcontrollers 112, one or more memory devices such as DDR4 503 and/or EEPROM, one or more OSCs, one or more passive components such as capacitors 127 and resistors 130, and/or other components. Any of the microcontrollers 112, one or more memory devices, OSCs, capacitors 127, resistors 130, and/or other components may be mounted to the upper-level PCB 103a on a top-side or a bottom-side.

As illustrated by the side profile of the upper-level PCB 103a in FIG. 5C, the PCB 103a may be detachable from other PCB levels of the BMC structure 100. Communication between the upper-level PCB 103a and other levels of the BMC structure 100 may be established via the electrical communication channels 106. As illustrated in FIG. 5B, an electrical communication channel 106 may surround an outer perimeter of a lower side of the upper-level PCB 103a. However, it should be appreciated that other layouts may be used in certain embodiments.

Figure 6:
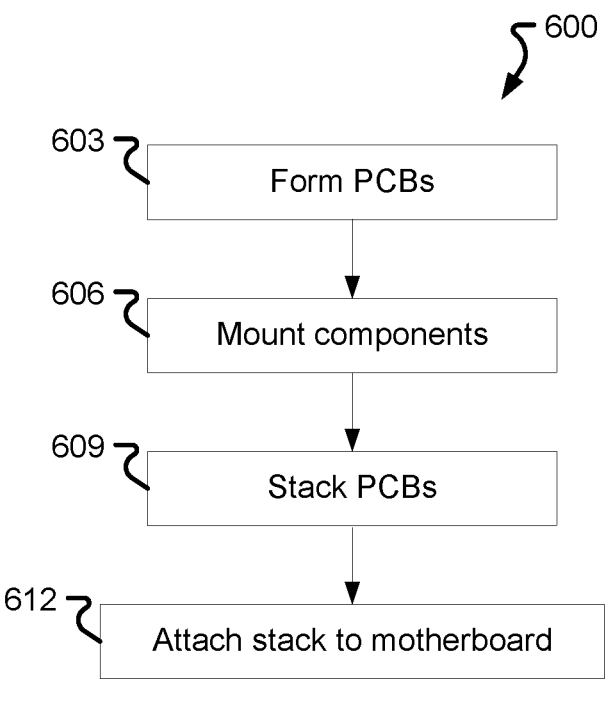
FIG. 6 is a flowchart of a method in accordance with one or more embodiments of the present disclosure.

A BMC structure 100 as described herein may in some embodiments be manufactured through a stacking process using a method 600 as illustrated in FIG. 6. The method may begin at 603 in which each of the PCBs 103a-d to be included in the BMC structure 100 may be formed. As described above, each of the PCBs 103a-d may be single- or multi-layer PCBs.

At 606, components may be soldered or otherwise mounted to each of the PCBs 103a-d. As described above, each PCB 103a-d may comprise a different set of components. Also, components may be soldered or mounted to either the top or bottom of each PCB 103a-d, with the exception of the PCB to be used as a bottom layer, on which an interface 133 may consume the bottom-side.

At 609, once the components are mounted to each of the PCBs 103a-d, the PCBs 103a-d may be stacked using supports 109. Upon being stacked, electrical communication channels 106 may be connected, enabling communication between each of the PCBs 103a-d. In some embodiments, the PCBs 103a-d may also be interconnected through the use of cables such as optical connections.

At 612, the BMC structure 100 including the stacked PCBs 103a-d may be attached to a main board of a device for which baseboard management is desired. Attaching the BMC structure 100 to a main board may comprise making a soldered BGA connection or fitting an interface 133 of the BMC structure into a socket of the main board.

Figure 7:
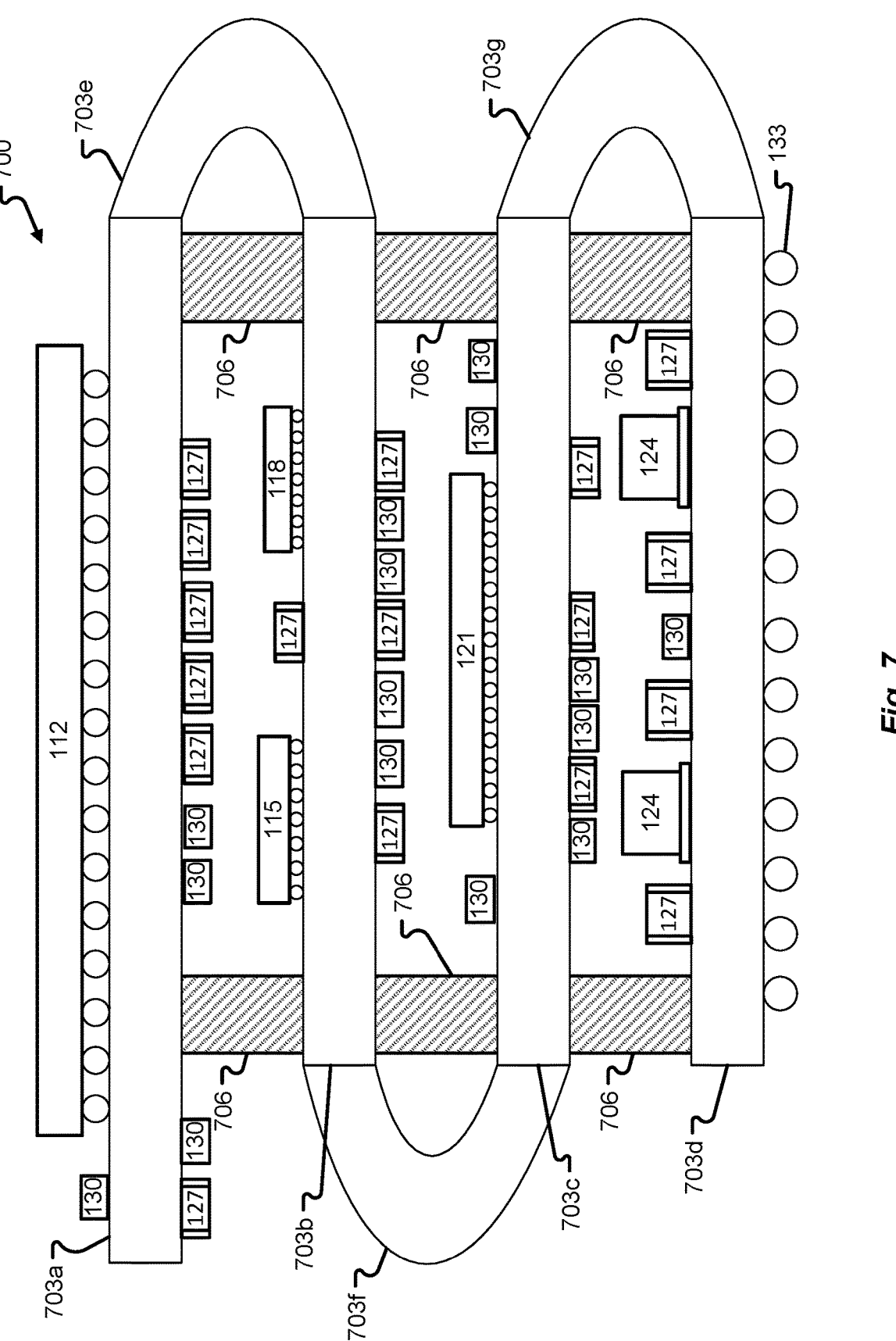
FIG. 7 is a block diagram of a BMC structure in accordance with one or more embodiments of the present disclosure.

In some embodiments, a BMC structure 700 may comprise a single flexible PCB as illustrated in FIG. 7. The single flexible PCB may comprise a series of flat PCB levels 703a-d interconnected by curved PCB sections 703e-g. The flexible PCB may be a single-layer or a multi-layer PCB.

It should be appreciated that in some embodiments, instead of a single flexible PCB, each flat PCB level 703a-d may be removably-connected to a separate curved PCB section 703e-g. Also, in some embodiments, instead of flexible curved PCB sections 703e-g, other types of connectors, such as ribbon cables or optical cables may be used.

While in some embodiments, a BMC structure 700 comprising a single flexible PCB may be capable of free-standing, one or more support elements 706, such as screws and washers may be used for structural support.

As illustrated in FIG. 7, the BMC structure 700 may include four levels 703a-d. Similar to the BMC structure 100 described above, it should be appreciated that in some embodiments other numbers of levels 703a-d may be used. For example, and as described above, a LAN level 703c may be omitted. Similar to the BMC structure 100 described above, the BMC structure 700 may be mounted to a main board of a device using a BGA interface 133 or other interface type.

Figure 8:
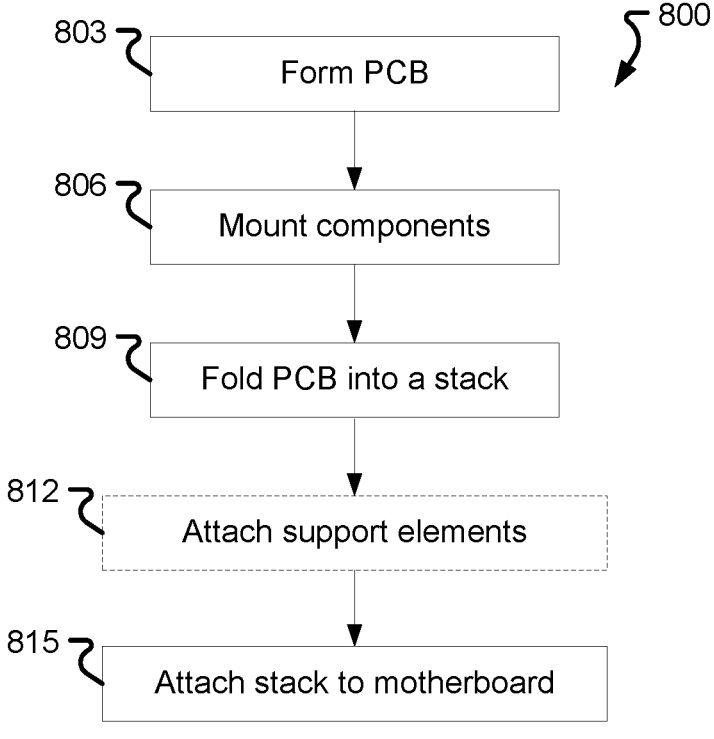
FIG. 8 is a flowchart of a method in accordance with one or more embodiments of the present disclosure.

A BMC structure 700 as described herein may in some embodiments be manufactured through a stacking process using a method 800 as illustrated in FIG. 8. The method may begin at 803 in which a flexible PCB to be folded into the BMC structure 100 may be formed. As described above, the flexible PCB may be a single- or multi-layer PCB. It should be appreciated that in some embodiments, as described above, multiple PCBs may be used to create a folded BMC structure 700. For example, a combination of flexible and non-flexible, or rigid, PCBs may be used.

At 806, components may be soldered or otherwise mounted to the flexible PCB. As described above, components may be soldered or mounted to either the top or bottom of the PCB. Because a single, or segmented, PCB to be folded into a BMC structure 700 as illustrated in FIG. 7 can be laid flat before being folded, the components on each of the top side and the bottom side can be mounted to the PCB at once. As should be appreciated, when laid flat, one side of the flexible PCB includes the top-side of levels 703a and 703c and the bottom-side of levels 703b and 703d, while the other side of the flexible PCB includes the bottom-side of levels 703a and 703c and the top-side of levels 703b and 703d.

At 809, once the components are mounted to the PCB, the PCB may be folded into a BMC structure 700 as illustrated in FIG. 7. Folding may be performed, for example, by hand or through the use of an automated machine. As illustrated in FIG. 7, the levels may be folded such that each may be of a different length. It should be appreciated that each level may also or alternatively be of a different width, as the flexible PCB may not necessarily be a simple rectangle.

At 812, an optional step of attaching support elements 706 may be performed to add structural support to the folded BMC structure 700. As described above, structural support elements 706 may comprise screws and washers, though it should be appreciated that other support elements 706 may be used.

At 815, the BMC structure 700 including the folded PCB may be attached to a main board of a device for which baseboard management is desired. Attaching the BMC structure 700 to a main board may comprise making a soldered BGA connection or fitting an interface 133 of the BMC structure 700 into a socket of the main board.

Figure 9A:
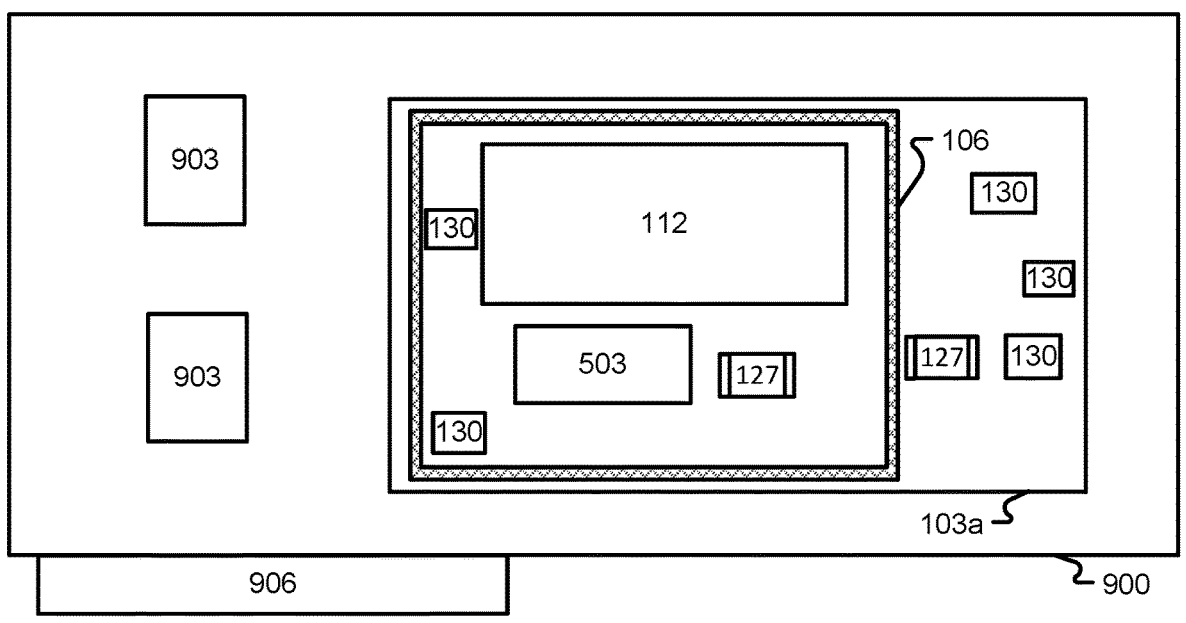
FIGS. 9A and 9B are block diagrams of a BMC structure on a main board in accordance with one or more embodiments of the present disclosure.
Figure 9B:
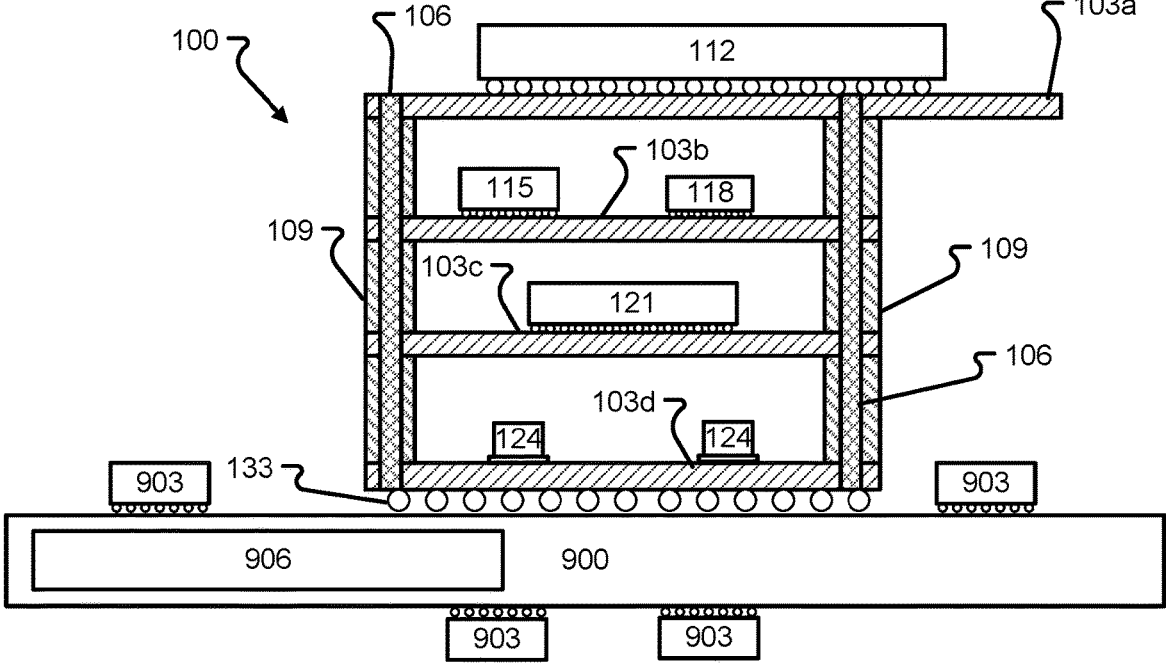

As illustrated in FIGS. 9A and 9B, a BMC structure 100 may be mounted to a main board 900 of a device such as a GPU or DPU. While the BMC structure 100 described above in relation to FIGS. 1-6 is illustrated in FIGS. 9A and 9B, it should be appreciated the same or a similar configuration may be achieved using a BMC structure 700 made from a flexible PCB as illustrated in FIGS. 7 and 8.

FIG. 9A illustrates a top-down view of a main board 900 on which a BMC structure 100 is mounted. As illustrated in FIG. 9A, the BMC structure 100 may be mounted to a top side of the main board 900. The main board 900 may also include other components 903 as well as a slot 906. The main board 900 may be, for example, a motherboard of a computing system such as a server, personal computer, GPU, DPU, CPU, or other computing system.

Other components 903 on the main board 900 may include, for example, one or more processing devices, memory devices, input/output interfaces, power management devices, thermal management devices, etc. The slot 906 of the main board 900 may be, for example, a PCIe slot capable of mounting to a PCIe socket of a motherboard of a computing system such as a server. In some embodiments, the interface 133 of the BMC structure 100 may be used in relation to any one or more of PCIe, universal serial bus (USB), Inter-Integrated Circuit (I2C), 13C, general-purpose input/output (GPIO), etc. As illustrated in FIG. 9B, the interface 133, which may, as discussed above, be a BGA, may be soldered to or removably attached to the main board 900.

Once mounted to the main board 900, the BMC structure 100 may be enabled to communicate with various components 903 on the main board 900 to perform functions such as monitoring and managing performance and status of the main board. Such functions may involve monitoring sensors such as temperature sensors and voltage sensors, managing performance of components such as fan controllers and power management devices, etc.

FIG. 9B illustrates a side profile of a main board 900 on which a BMC structure 100 is mounted. As illustrated in FIG. 9B, the overhanging top PCB 103*a* of the BMC structure 100 enables one or more components 903 on the main board 900 to be mounted directly below portions of the BMC structure 100. Also, because the BMC structure 100 consumes only a portion of one side of the main board 900, components 903 of the main board 900 may be mounted directly below any portion of the BMC structure 100. In these ways, a BMC structure 100 enables a greater number of components to be mounted to the main board 900 as compared to conventional BMC devices.

The present disclosure encompasses embodiments of the methods 600 and 800 that comprise more or fewer steps than those described above, and/or one or more steps that are different than the steps described above.

The present disclosure encompasses methods with fewer than all of the steps identified in FIGS. 6 and 8 (and the corresponding descriptions of the methods), as well as methods that include additional steps beyond those identified in FIGS. 6 and 8 (and the corresponding descriptions of the methods). The present disclosure also encompasses methods that comprise one or more steps from the methods described herein, and one or more steps from any other of the methods as described herein. Any correlation described herein may be or comprise a registration or any other correlation.

Embodiments of the present disclosure include a BMC structure (or a processing circuit), comprising: at least one microcontroller to provide baseboard management functions; two or more PCBs on which the at least one microcontroller and one or more peripheral circuits are mounted, wherein the one or more peripheral circuits comprise one or more of an EROT, a VR, a RAM device, a non-volatile memory device, and one or more passive components; and an interface to provide electrical communication to and from the BMC structure.

Aspects of the above BMC structure include wherein the BMC structure provides out-of-band management capabilities to an external device via the interface.

Aspects of the above BMC structure include wherein the two or more PCBs comprise at least three PCBs, wherein one or more voltage regulators are on a top side of a first PCB, one or more memory circuits are on a top side of a second PCB, one or more of the passive components are on a bottom side of the second PCB, the microcontroller is on a top side of a third PCB, and one or more of the passive components are on a bottom side of the third PCB.

Aspects of the above BMC structure include wherein the two or more PCBs comprise at least four PCBs, wherein one of the four PCBs comprises an ethernet switch.

Aspects of the above BMC structure include wherein microcontroller is a baseboard management controller.

Aspects of the above BMC structure include wherein a footprint of a bottom PCB of the two or more PCBs is smaller than a total area of the two or more PCBs.

Aspects of the above BMC structure include wherein a footprint of a bottom PCB of the two or more PCBs is less than one fourth of a total area of the two or more PCBs.

Aspects of the above BMC structure include wherein the two or more PCBs are connected by adapters connected to soldered points on each of the two or more PCBs.

Aspects of the above BMC structure include the BMC structure further comprising electrical links between each of the two or more PCBs providing structural support to one or more of the two or more PCBs.

Aspects of the above BMC structure include wherein a top PCB of the two or more PCBs encompasses a larger area as compared to another PCB of the two or more PCBs.

Aspects of the above BMC structure include wherein each of the two or more PCBs are separable.

Aspects of the above BMC structure include wherein one or more of the peripheral circuits are mounted to a first side of a first PCB of the two or more PCBs and one or more of the peripheral circuits are mounted to a second side of the first PCB of the two or more PCBs.

Aspects of the above BMC structure include the BMC structure further comprising a plurality of connectors, the connectors comprising one or more of Peripheral Component Interconnect Express (PCIe), universal serial bus (USB), Inter-Integrated Circuit (I2C), I3C, and general-purpose input/output (GPIO), and wherein the BMC structure provides the baseboard management functions for a server.

Aspects of the above BMC structure include wherein the interface comprises one of a soldered connection to a motherboard or a detachable connector.

Aspects of the above BMC structure include wherein the two or more PCBs are stacked vertically.

Embodiments of the present disclosure also include a BMC circuit, comprising: at least one microcontroller to provide baseboard management functions; two or more PCBs on which the at least one microcontroller and one or more peripheral circuits are mounted, wherein the one or more peripheral circuits comprise one or more of an external root of trust, a voltage regulator, a random-access memory device, a non-volatile memory device, and one or more passive components; and an interface providing electrical communication to and from the baseboard management controller circuit.

Embodiments of the present disclosure also include a processing circuit comprising: at least one microcontroller to provide baseboard management functions; a flexible PCB, wherein the flexible PCB forms two or more levels, wherein the at least one microcontroller and one or more peripheral circuits are mounted on one or more of the two or more levels, wherein the one or more peripheral circuits comprise one or more of an external root of trust, a voltage regulator, a random-access memory device, a non-volatile memory device, and one or more passive components; and an interface to provide electrical communication to and from the processing circuit.

Aspects of the above processing circuit include wherein each of the two or more levels is connected to another level by a screw.

Aspects of the above processing circuit include wherein a bottom level comprises a BGA.

Aspects of the above processing circuit include wherein the BGA is soldered to a motherboard.

Aspects of the above processing and/or BMC circuits include any one or more of the features as substantially disclosed herein in combination with any one or more other features as substantially disclosed herein.

Aspects of the above processing and/or BMC circuits include any one of the aspects/features/embodiments in combination with any one or more other aspects/features/embodiments.

Aspects of the above processing and/or BMC circuits include the use of any one or more of the aspects or features as disclosed herein.

It is to be appreciated that any feature described herein can be claimed in combination with any other feature(s) as described herein, regardless of whether the features come from the same described embodiment.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

What is claimed is:

1. A baseboard management controller (BMC) structure, comprising:
at least one microcontroller to provide baseboard management functions;
two or more printed circuit boards (PCBs) on which the at least one microcontroller and a plurality of peripheral circuits are mounted, wherein the plurality of peripheral circuits comprise one or more of an external root of trust, a voltage regulator, a random-access memory device, a non-volatile memory device, and one or more passive components; and
an interface to provide electrical communication to and from the BMC structure, wherein:

one or more of the plurality of peripheral circuits are on a top side of a first PCB of the two or more PCBs,
one or more of the plurality of peripheral circuits are on a bottom side of a second PCB of the two or more PCBs, and
the at least one microcontroller is mounted on a top side of the second PCB.

2. The BMC structure of claim 1, wherein the BMC structure provides out-of-band management capabilities to an external device via the interface.

3. The BMC structure of claim 1, wherein the two or more PCBs comprise at least three PCBs, wherein one or more voltage regulators are on the top side of the first PCB, one or more memory circuits are on a top side of a second third PCB of the two or more PCBs, and one or more of the passive components are on a bottom side of the third PCB.

4. The BMC structure of claim 1, wherein the two or more PCBs comprise at least four PCBs, wherein one of the four PCBs comprises a switch.

5. The BMC structure of claim 1, wherein the at least one microcontroller comprises a baseboard management controller.

6. The BMC structure of claim 1, wherein a footprint of a bottom PCB of the two or more PCBs is smaller than a total area of the two or more PCBs.

7. The BMC structure of claim 1, wherein a footprint of a bottom PCB of the two or more PCBs is less than one fourth of a total area of the two or more PCBs.

8. The BMC structure of claim 1, wherein the two or more PCBs are connected by adapters connected to soldered points on each of the two or more PCBs.

9. The BMC structure of claim 1, further comprising electrical links between each of the two or more PCBs providing structural support to one or more of the two or more PCBs.

10. The BMC structure of claim 1, wherein a top PCB of the two or more PCBs encompasses a larger area as compared to another PCB of the two or more PCBs.

11. The BMC structure of claim 1, wherein each of the two or more PCBs are separable.

12. The BMC structure of claim 1, further comprising a plurality of connectors, the connectors comprising one or more of Peripheral Component Interconnect Express (PCIe), universal serial bus (USB), Inter-Integrated Circuit (I2C), I3C, and general-purpose input/output (GPIO), and wherein the BMC structure provides the baseboard management functions for a server.

13. The BMC structure of claim 1, wherein the interface comprises one of a soldered connection to a motherboard or a detachable connector.

14. The BMC structure of claim 1, wherein the two or more PCBs are stacked vertically.

15. A baseboard management controller circuit, comprising:
at least one microcontroller to provide baseboard management functions;
two or more printed circuit boards (PCBs) on which the at least one microcontroller and a plurality of peripheral circuits are mounted, wherein the plurality of peripheral circuits comprise one or more of an external root of trust, a voltage regulator, a random-access memory device, a non-volatile memory device, and one or more passive components; and
an interface providing electrical communication to and from the baseboard management controller circuit, wherein:

one or more of the peripheral circuits are on a top side of a first PCB of the two or more PCBs, one or more of the peripheral circuits are on a bottom side of a second PCB of the two or more PCBs, and the at least one microcontroller is mounted on a top side of the second PCB.

16. A processing circuit, comprising:

at least one microcontroller to provide baseboard management functions;

a flexible printed circuit board (PCB), wherein the flexible PCB forms two or more levels, wherein the at least one microcontroller and a plurality of peripheral circuits are mounted on one or more of the two or more levels, wherein the plurality of peripheral circuits comprise one or more of an external root of trust, a voltage regulator, a random-access memory device, a non-volatile memory device, and one or more passive components; and

18 an interface to provide electrical communication to and from the processing circuit, wherein:

one or more of the peripheral circuits are on a top side of a first level of the two or more levels, one or more of the peripheral circuits are on a bottom side of a second level of the two or more levels, and the at least one microcontroller is mounted on a top side of the second level.

17. The processing circuit of claim 16, wherein each of the two or more levels is connected to another level by a screw.

18. The processing circuit of claim 16, wherein a bottom level comprises a ball grid array (BGA).

19. The processing circuit of claim 18, wherein the BGA is soldered to a motherboard.

20. The processing circuit of claim 16, wherein a top level of the two or more levels encompasses a larger area as compared to another level of the two or more levels.

* * * * *